(12) United States Patent
Akimoto

(10) Patent No.: US 8,110,893 B2
(45) Date of Patent: Feb. 7, 2012

(54) SEMICONDUCTOR DEVICE MOUNTED WITH FUSE MEMORY

(75) Inventor: Kengo Akimoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 18 days.

(21) Appl. No.: 12/837,060

(22) Filed: Jul. 15, 2010

(65) Prior Publication Data

US 2010/0276782 A1 Nov. 4, 2010

Related U.S. Application Data

(62) Division of application No. 11/812,530, filed on Jun. 19, 2007, now Pat. No. 7,759,765.

(30) Foreign Application Priority Data

Jul. 7, 2006 (JP) ................................. 2006-188417

(51) Int. Cl.
*H01L 23/52* (2006.01)
(52) U.S. Cl. ................. 257/529; 257/530; 257/E23.147; 257/E23.149; 257/E21.592
(58) Field of Classification Search .................. 257/529, 257/530, E23.147, E23.149, E21.592
See application file for complete search history.

(56) References Cited

U.S. PATENT DOCUMENTS

| | | | |
|---|---|---|---|
| 5,242,851 A | 9/1993 | Choi | |
| 5,705,849 A * | 1/1998 | Zheng et al. ................. | 257/530 |
| 5,903,041 A | 5/1999 | La Fleur et al. | |
| 6,969,869 B2 | 11/2005 | Hudgens et al. | |
| 6,985,378 B2 | 1/2006 | Kozicki | |
| 7,470,979 B2 | 12/2008 | Hashimoto | |
| 7,476,587 B2 | 1/2009 | Lung | |
| 7,511,362 B2 | 3/2009 | Hashimoto | |
| 7,638,359 B2 | 12/2009 | Lung | |
| 7,658,333 B2 | 2/2010 | Koyama et al. | |
| 7,699,232 B2 | 4/2010 | Koyama et al. | |
| 2004/0178425 A1 | 9/2004 | Kato | |
| 2008/0179706 A1* | 7/2008 | Kim et al. ..................... | 257/529 |
| 2009/0115020 A1* | 5/2009 | Yang et al. .................... | 257/529 |
| 2009/0184389 A1 | 7/2009 | Bertin et al. | |
| 2009/0195289 A1 | 8/2009 | Subramanian et al. | |
| 2009/0218656 A1* | 9/2009 | Gonzalez et al. ............. | 257/529 |
| 2011/0101496 A1* | 5/2011 | Park et al. ..................... | 257/530 |

FOREIGN PATENT DOCUMENTS

| | | |
|---|---|---|
| JP | 05-136269 | 6/1993 |
| JP | 2005-123361 | 5/2005 |
| JP | 2005-251183 | 9/2005 |

\* cited by examiner

*Primary Examiner* — Ngan Ngo

(74) *Attorney, Agent, or Firm* — Eric J. Robinson; Robinson Intellectual Property Law Office, P.C.

(57) ABSTRACT

A fuse element utilizing a reaction between two layers by feeding current is manufactured. A fuse element including a first layer formed of an oxide or a nitride and a second layer that becomes high resistant by nitridation or oxidation, in which the first layer and the second layer are in contact with each other, is manufactured. For example, the fuse element is manufactured by using indium tin oxide for the first layer and aluminum for the second layer. By generating joule heat by applying voltage to the first layer and the second layer, oxygen in the indium tin oxide enters the aluminum, which changes the aluminum into aluminum oxide that presents an insulating property. The fuse element can be manufactured by a similar process as that of forming a TFT.

30 Claims, 8 Drawing Sheets

SEMICONDUCTOR DEVICE MOUNTED WITH FUSE MEMORY

BACKGROUND OF THE INVENTION

1. Field of the Invention

The present invention relates to a semiconductor device including a storage element and a method of manufacturing the semiconductor device. The present invention particularly relates to a semiconductor device using a fuse element as the storage element.

2. Description of the Related Art

In a society as in the present day society using many electronic appliances, a variety of data are generated or used, and storage devices (hereinafter referred to as "memory") are necessary for storing these data. The variety of memories produced or used currently all have advantages and disadvantages, and they are used according to use or the type of data to be handled.

The memories can be roughly classified into volatile memories and non-volatile memories. A volatile memory is a memory whose stored content is lost if power is not supplied. A non-volatile memory is a memory whose stored content is retained even without a supply of power. A DRAM (Dynamic Random Access Memory), an SRAM (Static Random Access Memory), or the like is given as the volatile memory. Although use of the volatile memory is very limited since the stored content is lost when power supply is turned off, the volatile memory is used for a cash memory of a computer or the like because the volatile memory has short access time. Further, although increase in capacity is easy with the DRAM since its memory cell is small, a controlling method is complex and power consumption is high. Furthermore, although a memory cell of the SRAM includes a CMOS and a manufacturing process and control method are easy, it is not suitable for an increase in capacity because six transistors are necessary in one memory cell.

The non-volatile memories whose storage contents are retained without a supply of power can be roughly classified into three categories, which are a rewritable type, a write-once type, and a mask-ROM (Read Only Memory). In the rewritable type, stored content can be rewritten within a limited number of times it can be rewritten. In the write-once type, a user of the memory can write in data only once. In the mask ROM, data content is set during manufacturing and the data content cannot be rewritten.

As the re-writable nonvolatile memory, an EPROM, flash memory, ferroelectric memory, or the like is given. Writing operation of the EPROM is easy and unit price is relatively low, but a dedicated programming device and erasing device are necessary for writing and erasing. In the flash memory or ferroelectric memory, rewriting can be done over a substrate that is used, and it has short access time as well as low power consumption; however, unit price per bit is high because a step of building-in a floating gate or a ferroelectric layer during manufacturing is necessary.

A memory cell of a write-once nonvolatile memory includes a fuse or anti-fuse, a cross pointer diode, an OLED (Organic. Light Emitting Diode), a bistable liquid crystal element, or another device whose state changes by heat or light. Usually, data is stored by each memory cell in the memory being in one of two states (a first state and a second state). In the write-once storage device, all memory cells are manufactured to be in one state (the first state) during manufacturing, then selected memory cells are changed to the other state (the second state) by a writing process. This change from the first state to the second state is irreversible, and a memory cell that is changed once cannot be returned to the original state.

Note that an IC tag can be given as an example of a semiconductor device in which a memory and another functional circuit is built over a substrate. A memory included in an IC tag is an SRAM, a mask ROM, a flash memory, a ferroelectric memory, or the like. Since data content is set during manufacturing memories in the mask ROM, a user of the IC tag cannot write in data. Further, since one memory is necessary for one data, when a memory of different data content is necessary, a photomask corresponding to each type of data becomes necessary. Accordingly, a mask ROM is not practical in terms of cost.

A manufacturing process of the aforementioned write-once memory often differs with those of a central processing unit (hereinafter referred to as "CPU"), an arithmetic function circuit, a rectifying circuit, a control circuit, and the like (these circuits are hereinafter referred to as "other functional circuits" to differentiate from the write-once memory). Accordingly, even when the memory and TFTs forming the foregoing circuits are to be manufactured over the same substrate, it is necessary to form them using different materials in different manufacturing steps.

Note that for the flash memory or ferroelectric memory, a special step to build-in the memory, such as a step of building-in a floating gate or a ferroelectric layer in a gate insulating layer as mentioned above, is necessary. On the other hand, circuits other than the memory fanned in an IC tag can be built-in within the manufacturing process of CMOS. That is, the other circuits can be manufactured using a manufacturing technique of a TFT (Thin Film Transistor). Therefore, if a useful memory can be manufactured by the TFT manufacturing technique, a semiconductor device in which a memory and other functional circuits are mounted over the same substrate can be manufactured.

That which is called an IC tag, ID chip, or the like as mentioned above can be manufactured by a TFT manufacturing process. In the ID chip, necessary information is stored in a storage element in the IC chip, and the information inside is read using non-contact means, or in general, wireless communication means. By practical application of such an ID chip, commodity distribution and the like are expected to be simplified, improved in efficiency, reduced in cost, and improved in security.

The ID chip includes a memory holding portion for identifying individual information. The ID chip is differentiated from other ID chips according to the stored individual information. With this, identification of a product or management of stock is possible. An example of individual authentication using an ID chip is described with reference to FIG. 4. FIG. 4 is a conceptual diagram of individual authentication by which individual information of a bag is read without contact. An ID chip 401 storing specific individual information is provided to a bag 404 by being attached to the outside of the bag 404. An electromagnetic wave is transmitted to this ID chip 401 from an antenna unit 402 of a reader/writer 403. When the ID chip 401 receives the transmitted electromagnetic wave, the ID chip 401 sends individual information of the ID chip 401 to the antenna unit 402. The antenna unit 402 sends the received individual information to the reader/writer 403, and the reader/writer 403 differentiates the individual information. In this manner, information of the bag 404 is obtained by the reader/writer 403. By using a system such as that shown in FIG. 4, distribution management, tabulation, elimination of counterfeited items, and the like become easy.

As one of such techniques by which individual information is stored in individual ID chips, there is a fuse memory element (a storage element of a nonvolatile memory using a fuse element). A fuse memory element is a storage element that stores information by selectively applying high voltage to a memory cell to insulate the selected place or make it be in a state of high resistance. A conventional fuse memory element is insulated by selectively breaking a junction or by melting (For example, Patent Document 1: Japanese Published Patent Application No. 2005-251183).

On the other hand, there is an anti-fuse element as an element similar to the fuse element. The anti-fuse element has high resistance in the first state, but by applying voltage, it transitions to the second state with low resistance (for example, Patent Document 2: Japanese Published Patent Application No. Hei 5-136269).

When a junction is broken or melting is carried out as done with a conventional fuse memory element, a region with sufficient area is necessary so that a broken junction portion or a melted portion can be insulating for sure, which becomes a hindrance in size reduction. It is particularly unsuited for an IC tag or the like in which miniaturization of a pattern wiring and size reduction of a device is demanded. Also, since a structure itself changes in shape by the break of the junction and by melting, another wiring is affected in no small measure within an element.

Further, there are still problems with the conventional semiconductor device such as the following. One is that when a mask ROM is used in a memory circuit, writing cannot be carried out except for during chip manufacturing. Therefore, an ID chip to which data can be written other than during chip manufacturing is in demand. Also, when an EPROM (Erasable Programmable Read Only Memory) typified by an EEPROM (Electronically Erasable and Programmable Read Only Memory) is used for a memory circuit, although a user can freely rewrite content, counterfeiting is also possible since a person other then the right user can rewrite information for authentication that should not be rewritten. This is a serious fatal flaw from a perspective of ID tag security. Accordingly, an ID chip that can only be written once for preventing such counterfeiting is in demand. As such memory that can only be written once, which maintains storage by insulating a fuse portion or making the fuse portion to have high resistance, there is a PROM (Programmable Read Only Memory).

SUMMARY OF THE INVENTION

An object of the present invention is to provide a semiconductor device in which information cannot be rewritten or counterfeited by a person other than the right user, by using a fuse memory element for a PROM.

Also, for many conventional storage elements, particular steps for manufacturing the storage elements are necessary. Accordingly, it is difficult to manufacture the storage elements over the same substrate as other functional circuits. Even when the storage elements are manufactured over the same substrate as other functional circuits, it is necessary to add a step other than a TFT manufacturing process. This means that there is extra cost in manufacturing a semiconductor device having one function, for example an IC tag or the like, for manufacturing a memory. The present invention provides a fuse memory element manufactured over the same substrate as other functional circuits, using a TFT manufacturing process. Further, the present invention provides an easy-to-use, inexpensive semiconductor device including a storage element without limiting specifications of a product or causing reduction in productivity even when the storage element is manufactured over the same substrate as other functional circuits.

A semiconductor device of the present invention includes a fuse element as a storage element. A fuse memory element has a stacked-layer structure in which a second layer including oxygen is provided over a first layer including a substance presenting an insulating property by oxidation. By selectively applying voltage to such a stacked-layer structure with an electromagnetic wave or by a method of directly feeding current, or the like, in order to make it highly electrically resistant (desirably insulating), a desired circuit configuration is realized.

Sheet resistance of the first layer increases by thinning its film thickness. Sheet resistance refers to resistance per unit area. By an increase in sheet resistance, joule heat by current feeding increases. By the increase in joule heat, oxygen is released from the second layer including oxygen and the oxygen is supplied to the first layer. An oxide can be Mimed by the oxygen oxidizing a substance in the first layer, so that the first layer comes to a state of insulation or high resistance.

One feature of the present invention is a fuse element in which a first layer and a second layer are provided to be partially or completely in contact with each other. The first layer mainly contains an oxide, a nitride or an oxynitride and the second layer has a conductive property and mainly contains a substance that presents an insulating property by oxidation or nitridation. The second layer comes to have high resistance by feeding current to one or both of the first layer and the second layer so that heat is generated and a part or the entire second layer is oxidized or nitrided.

One feature of the present invention is a fuse element including a first layer, a second layer provided to be partially or completely in contact with the first layer, and a third layer selectively provided to be partially in contact with the first layer. The first layer mainly contains an oxide, a nitride, or an oxynitride, and the second layer has a conductive property and mainly contains a substance that presents an insulating property by oxidation or nitridation. The third layer has a conductive property and fauns the first electrode and the second electrode. The second layer comes to have high resistance by feeding current between the first electrode and the second electrode so that heat is generated and a part or the entire second layer is oxidized or nitrided.

One feature of the present invention is a fuse element including a first layer, a second layer provided to be partially or completely in contact with the first layer, and a third layer selectively provided to the partially in contact with the second layer. The first layer mainly contains an oxide, a nitride, or an oxynitride, the second layer has a conductive property and mainly contains a substance that presents an insulating property by oxidation or nitridation, and the third layer has a conductive property and forms a first electrode and a second electrode. The second layer comes to have high resistance by feeding current between the first electrode and the second electrode so that heat is generated and a part or the entire second layer is oxidized or nitrided.

In the present invention of the foregoing structure, the first layer preferably has a conductive property.

In the present invention of the foregoing structure, the first layer preferably includes indium tin oxide, indium tin oxide containing silicon oxide, or indium oxide-zinc oxide.

In the present invention of the foregoing structure, the second layer preferably includes aluminum, bismuth, or tin.

In the present invention of the foregoing structure, it is preferable that the first layer mainly contains indium tin oxide and the second layer mainly contains aluminum.

A fuse element of the present invention can be mounted to a semiconductor device.

Fuse elements of the present invention are preferably arranged in a matrix form.

It is preferable that the fuse elements of the present invention have a structure in which they are each connected to a transistor and the transistor selects one fuse element.

Note that in the present invention, a semiconductor device refers to a device including a circuit containing a semiconductor element (such as a transistor or diode). Also, it may refer to devices in general that can function by utilizing a semiconductor characteristic.

Since sufficient region for carrying out insulation for sure is not necessary for a fuse element of the present invention, the fuse element and a semiconductor device including the fuse element can be reduced in size. Further, since deformation of a wiring due to the fuse element becoming insulating or high resistant does not occur, degradation of a characteristic of another circuit and reduction in yield due to the degradation can be prevented.

A fuse element of the present invention can be formed by a TFT manufacturing process; therefore, it can be formed over the same substrate as another circuit necessary for operation a semiconductor device.

Since writing in a storage element using the fuse element of the present invention can be done only once, reliability of individual identification information is high, and a high-security semiconductor device can be provided.

DETAILED DESCRIPTION OF THE INVENTION

Embodiment Mode

Hereinafter, embodiment modes of the present invention will be described with reference to drawings. However, the present invention can be embodied in many different modes and it is easily understood by those skilled in the art that modes and details can be variously changed without departing from the scope and the spirit of the present invention. Therefore, the present invention should not be construed as being limited to description of the embodiment modes.

Embodiment Mode 1

Figure 1A:
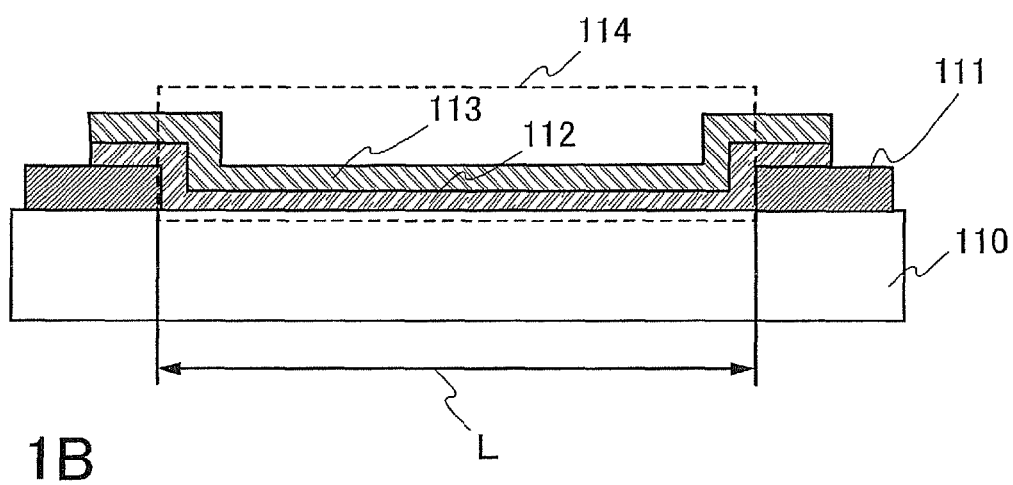
FIGS. 1A and 1B are diagrams showing a fuse element of the present invention.
Figure 1B:
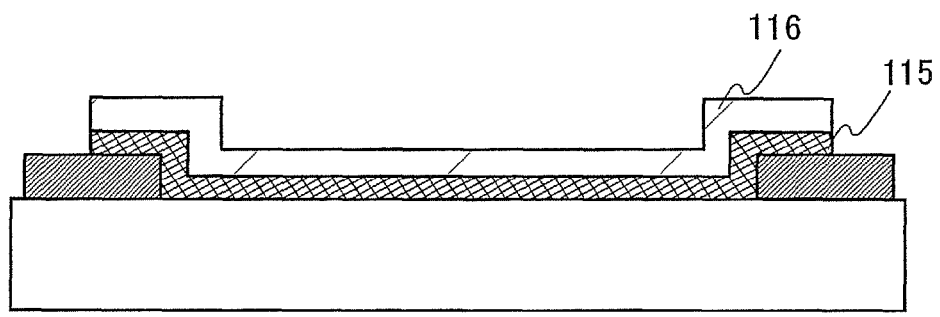

An embodiment mode of the present invention will be described with reference to FIGS. 1A and 1B. A fuse element 114 in FIG. 1A includes over a substrate 110 terminal electrode layers 111 that become terminal electrodes; a first fuse layer 112 provided to partially or entirely cover the substrate 110 and the terminal electrode layers 111; and a second fuse layer 113 over the first fuse layer 112. The terminal electrode layers 111 are provided to be isolated from each other.

A substrate having an insulating property (an insulating substrate) is used for the substrate 110. For example, a glass substrate, a plastic substrate, or the like can be used. In this embodiment mode, a glass substrate is used for the substrate 110. The glass substrate used for the substrate 110 is not particularly limited, and a quartz glass substrate, an alkali-free glass substrate such as a borosilicate glass substrate, or an alumino silicate glass substrate may be used.

Also, since it is acceptable as long as the substrate 110 has sufficient heat resistance in a manufacturing process and has an insulating property on a surface, a conductive substrate or a semiconductor substrate with an insulating film thereover may be used.

First, the terminal electrode layers 111 of a fuse element are formed over the substrate 110. It is acceptable as long as the terminal electrode layers 111 include a conductive substance. The terminal electrode layers 111 are preferably provided using a substance with low resistance, and a substance that does not inhibit formation of the first fuse layer 112 and the second fuse layer 113 to be formed in a later step is used. Here, titanium may be used for example.

Next, the first fuse layer 112 is formed over the substrate 110 and the terminal electrode layers 111. A conductive oxide may be used for the first fuse layer 112, and ITO (indium tin oxide), IZO (indium oxide containing zinc oxide), zinc oxide or the like can be typically given. Also, ITSO (indium tin oxide containing silicon oxide) foamed by a sputtering method using a target of ITO containing 2 to 10% silicon oxide by weight may be used. Note that IZO is an oxide conductive material formed by a sputtering method using a target of indium oxide containing 2 to 20% zinc oxide by weight. Alternatively, a conductive material of zinc oxide doped with gallium, tin oxide, zinc oxide doped with gallium oxide, zinc oxide doped with aluminum oxide, or zinc oxide doped with silicon oxide may be used. A known method may be used for the formation, and for example, a sputtering method, a CVD method, a droplet discharging method, or the like can be given. Here, ITO is used for the first fuse layer 112.

Subsequently, the second fuse layer 113, which is a precursor of an insulating oxide, is formed. The second fuse layer 113 is formed of a conductive substance that presents an insulating property when oxidized. For example, aluminum, tin, bismuth, or the like can be used. Here, the second fuse layer 113 is formed of aluminum. The terminal electrode layers 111 and the first fuse layer 112 are formed to be stacked and in contact with each other. In this manner, the fuse element 114 is manufactured (see FIG. 1A).

By applying voltage to a fuse element manufactured in the foregoing manner, joule heat is generated. Here, since titanium, ITO, and aluminum are used for the terminal electrode layers 111, the first fuse layer 112, and the second fuse layer 113, respectively, oxygen contained in the first fuse layer 112 is diffused to the second fuse layer 113 to oxidize the second fuse layer 113. A constant-voltage power source is used for the voltage application. This is because if a constant-current power source is used here, the first fuse layer 112 and the second fuse layer 113 are easily short-circuited since they have low resistance, and thus joule heat is not sufficiently generated. Joule heat is generated by gradually increasing amount of current using the constant-voltage power supply so that the second fuse layer 113 is oxidized and becomes an insulating oxide 116. Here, the insulating oxide 116 is aluminum oxide. Also, an amount of oxygen contained in the first fuse layer 112 is reduced and the first fuse layer 112 transforms into a second layer 115; therefore, electrical resistance changes and favorable conductivity is not obtained (see FIG. 1B).

As described above, by using the present invention, a fuse element can be manufactured without breaking a junction or melting a fuse. Accordingly, sufficient region for carrying out insulation that is conventionally necessary is not necessary. Therefore, the fuse element can be reduced in size, and a semiconductor device including the fuse element can also be reduced in size. In addition, since deformation of a wiring does not occur as it does in a case of breaking a junction or melting a fuse, there is no effect on a wiring portion except the fuse element, which can prevent characteristic degradation or reduction in yield, and improves reliability.

In this embodiment mode, although a conductive substance containing oxygen is used for the first fuse layer 112 and a conductive substance of which an oxide becomes an insulating substance is used for the second fuse layer 113, the present invention is not limited thereto, and this stacked-layer structure may be reversed. In other words, the first fuse layer 112 may be formed of the conductive substance of which an oxide becomes an insulating substance and the second fuse layer 113 may be formed of the conductive substance containing oxygen. However, with this stacked-layer structure, the first fuse layer 112 becomes conductive very easily when voltage is applied, and there is concern of a short circuit. Therefore, it is necessary that there is sufficient distance between the terminal electrodes.

Figure 8A:
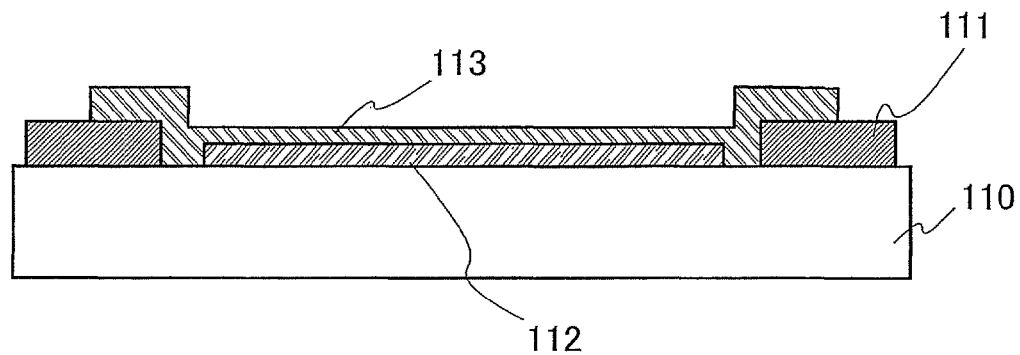
FIGS. 8A to 8C are diagrams showing a fuse element of the present invention.
Figure 8B:
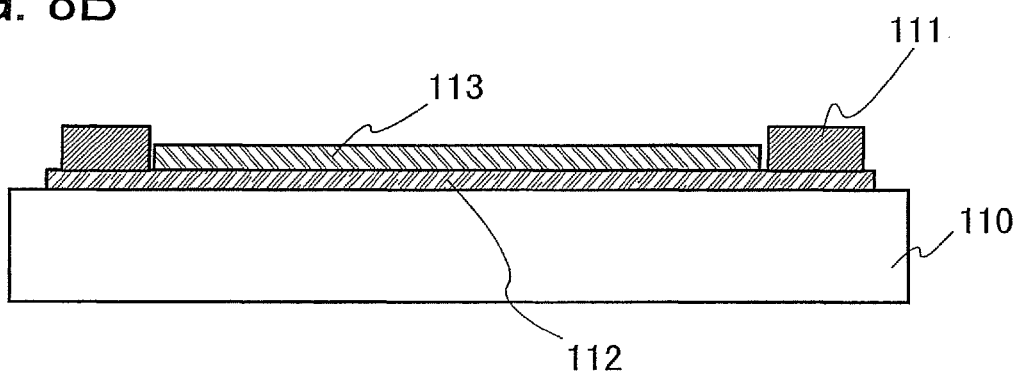
Figure 8C:
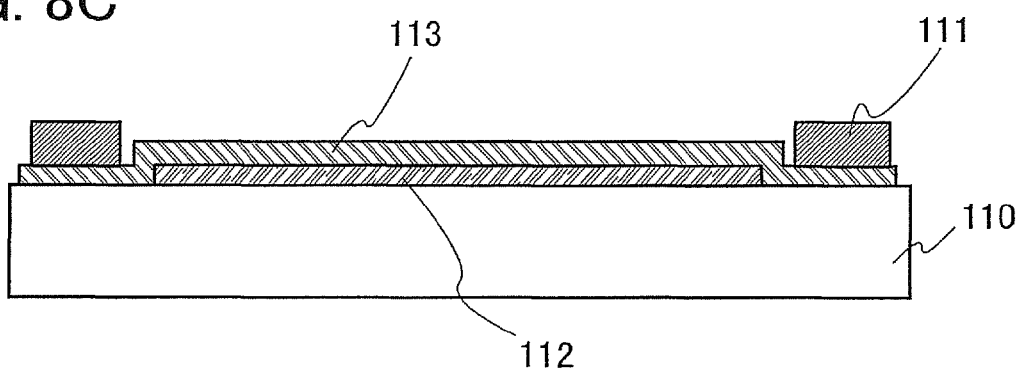

Also, although the terminal electrode layers 111 and the first fuse layer 112 are formed to be in contact with each other in this embodiment mode, the present invention is not limited thereto. For example, the terminal electrode layers 111 and the second fuse layer 113 may be formed to be in contact with each other (see FIGS. 8A and 8C). Alternatively, the terminal electrode layers 111 may be formed after forming the first fuse layer 112 and the second fuse layer 113 (see FIGS. 8B and 8C). That is, the terminal electrode layers may be formed above the two layers that become the fuse.

By the present invention, a small size fuse element can be formed over an insulating substrate using a TFT manufacturing process. Also, since deformation of a wiring does not occur as it does with a conventional fuse element in which a junction is broken or melting is carried out, there is little effect on a wiring portion except the fuse element and characteristic degradation or reduction in yield can be prevented. Further, since a fuse memory element can only be written once, by applying the present invention to an ID chip or the like, a high-security semiconductor device can be provided.

Embodiment Mode 2

Figure 3:
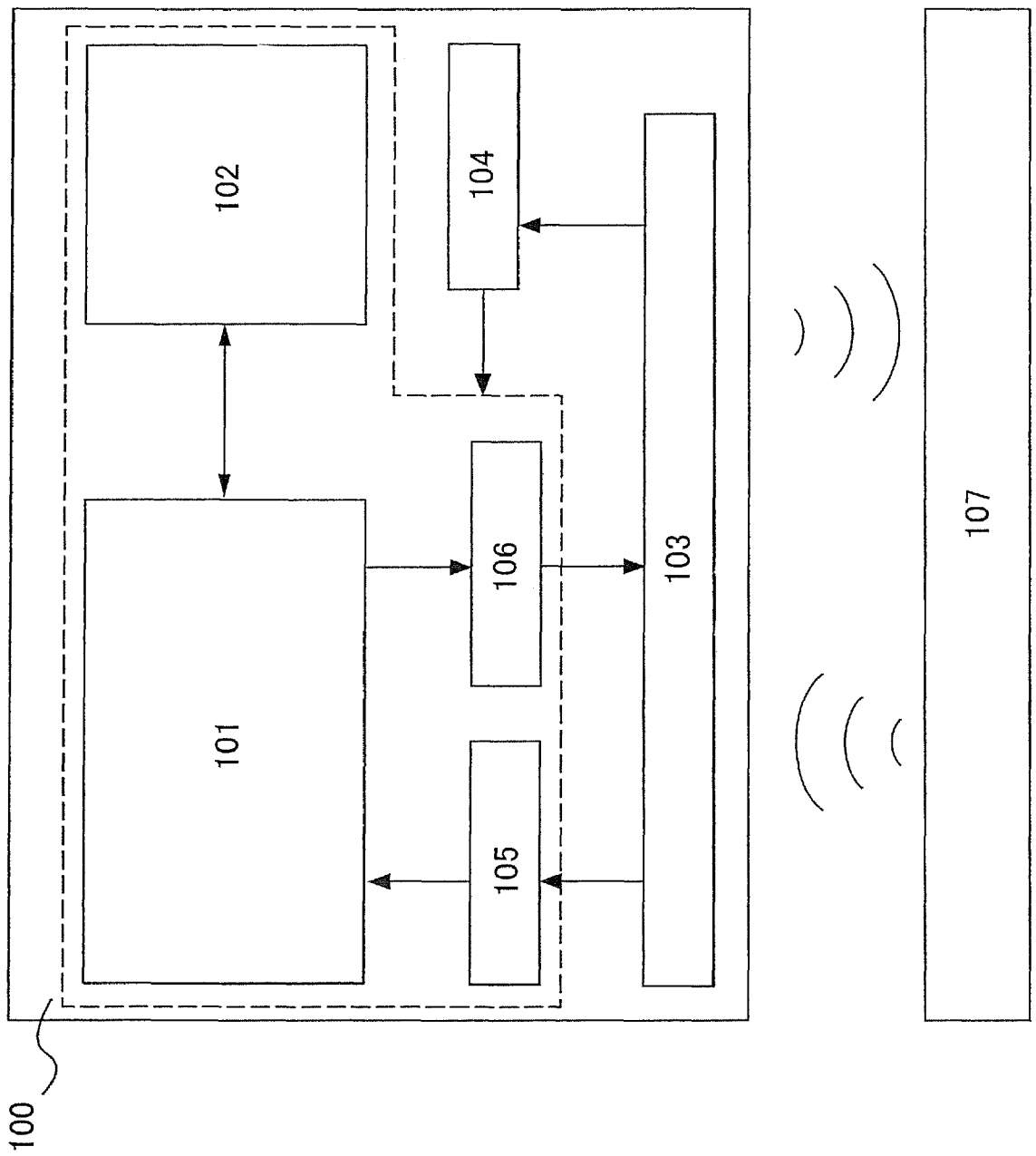
FIG. 3 is a diagram showing one mode of a semiconductor device of the present invention.
Figure 4:
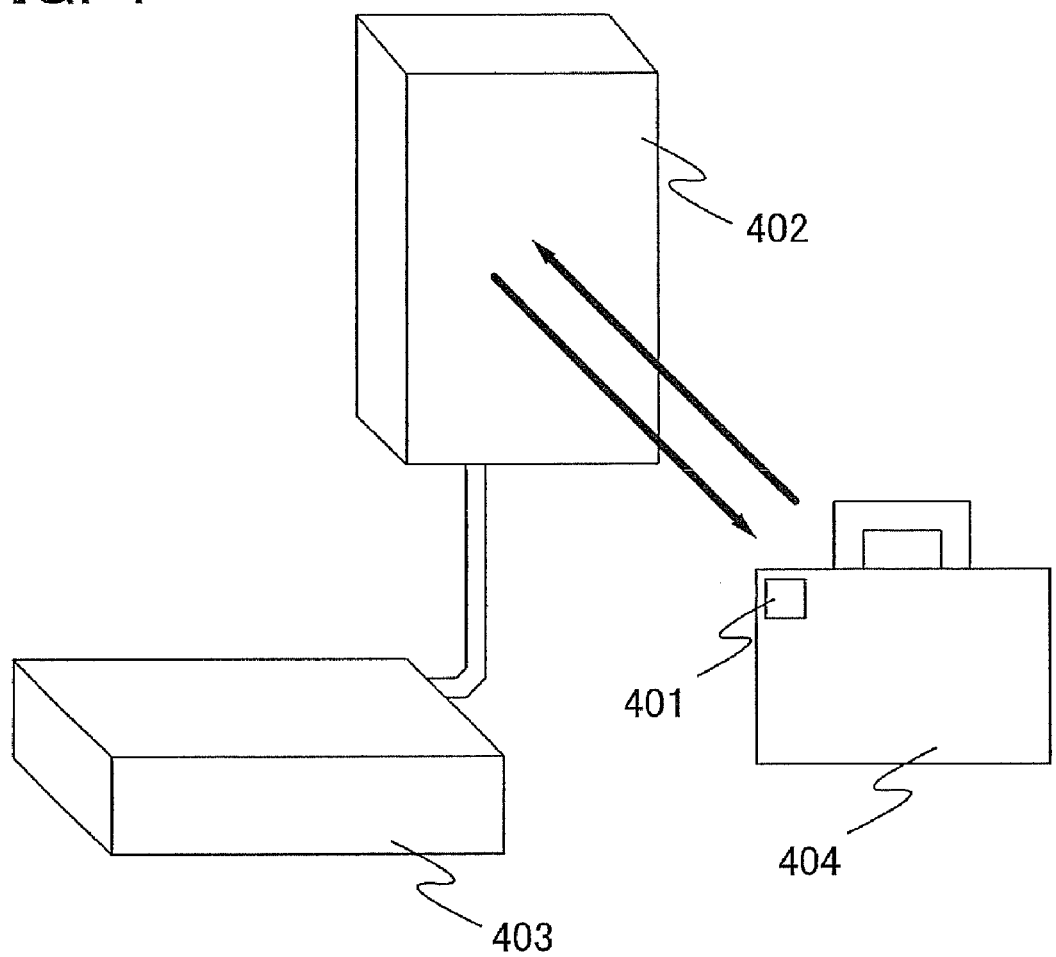
FIG. 4 is a diagram showing one mode utilizing a semiconductor device of the present invention.

In this embodiment mode, a mode is described in which a semiconductor device capable of wireless communication, such as an IC tag, is mounted with a fuse memory element to which the present invention is applied. An example of a structure of a semiconductor device of the present invention is described with reference to FIG. 3. A semiconductor device 100 of the present invention includes an arithmetic processing circuit 101, a storage circuit 102, an antenna 103, a power source circuit 104, a demodulation circuit 105, and a modulation circuit 106.

The arithmetic processing circuit 101 performs analysis of an instruction, control of the storage circuit 102, output of data to be transmitted outside to the modulation circuit 106, and the like based on a signal input from the demodulation circuit 105.

The memory circuit 102 includes a circuit including a storage element and a control circuit for performing writing and reading of data. In the memory circuit 102, at least an individual identification number of the semiconductor device itself is stored. The individual identification number is used for distinguishing the semiconductor device from other semiconductor devices. In addition, the memory circuit 102 includes one or more kinds of memories such as an organic memory, a DRAM (Dynamic Random Access Memory), an SRAM (Static Random Access Memory), a PROM (Programmable Read Only Memory), an EPROM (Electrically Programmable Read Only Memory), an EEPROM (Electrically Erasable Programmable Read Only Memory), and a flash memory. When the individual identification number is written in a rewritable flash memory or the like, it is easily rewritten and there is serious flaw in security. Therefore, a write-once type ROM is used for storing an individual identification number. In this embodiment mode, a fuse element to which the present invention is applied can be used as the write-once type ROM.

The antenna 103 converts a carrier wave supplied from an antenna 107 of a reader/writer into an AC signal. Also, load modulation is added by the modulation circuit 106. The power source circuit 104 generates power source voltage using the AC signal converted by the antenna 103 and supplies the power source voltage to each circuit.

The demodulation circuit 105 demodulates the AC signal converted by the antenna 103 and supplies the demodulated signal to the arithmetic processing circuit 101. The modulation circuit 106 adds load modulation to the antenna 103 based on a signal supplied from the arithmetic processing circuit 101.

The antenna 107 of the reader/writer receives the load modulation added by the antenna 103 as a carrier wave. Also, the antenna 107 of the reader/writer transmits the carrier wave to the semiconductor device 100. Note that a carrier wave is an electromagnetic wave that is transmitted and received by the antenna 107 of the reader/writer, and the antenna 107 of the reader/writer receives a carrier wave that is modulated by the modulation circuit 106.

Figure 6:
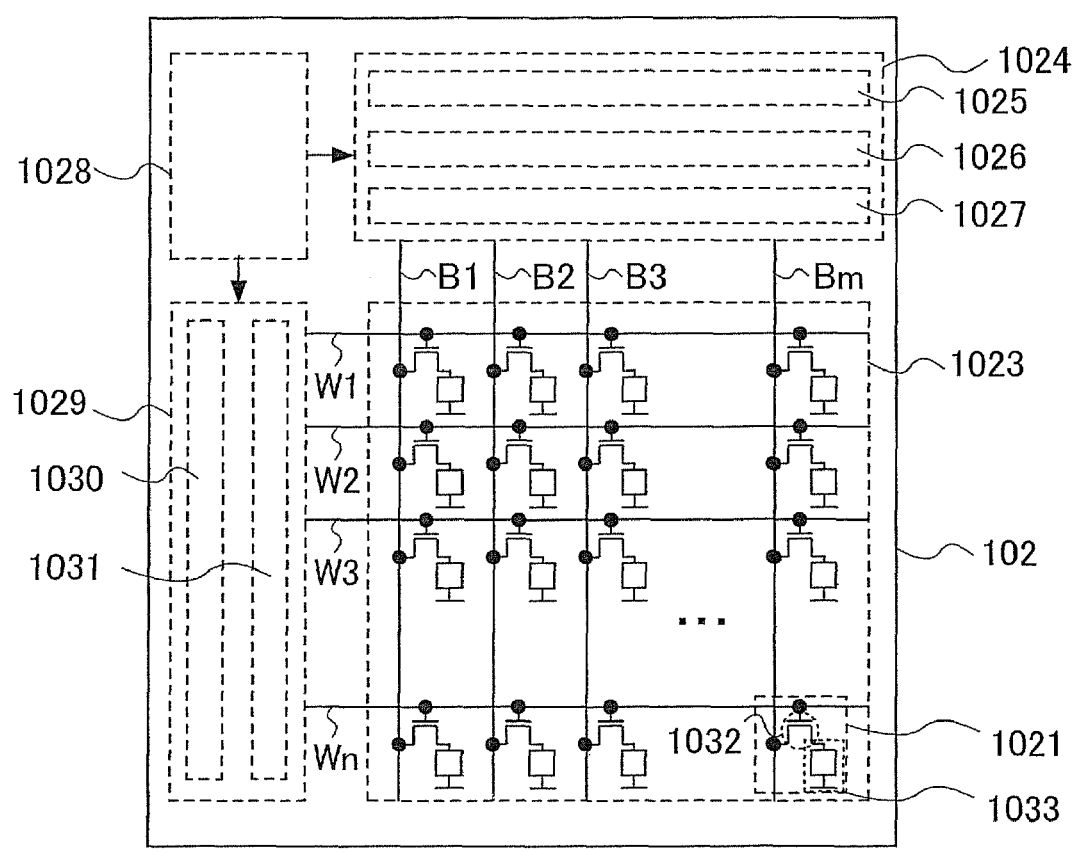
FIG. 6 is a circuit diagram showing a semiconductor device mounted with a fuse memory of the present invention.

A structure in which the storage circuit 102 is mounted with storage elements to which the present invention is applied, which are arranged in a matrix faint, is shown in FIG. 6. Note that in FIG. 6, although only a fuse element of the present invention is used as the storage element, the present invention is not limited thereto. The storage circuit 102 may include a first storage circuit using a fuse element for storing individual identification information of the semiconductor device 100 and a second storage circuit using a memory. By the storage circuit 102 including for example an SRAM for the second storage circuit using a memory besides the fuse element, temporary storage of data generated in the arithmetic processing circuit 101 becomes possible, and a characteristic of the semiconductor device 100 is improved.

FIG. 6 shows an example of a structure of the storage circuit 102 in which storage elements of the present invention are arranged in a matrix form. The storage circuit 102 includes a memory cell array 1023 in which memory cells 1021 are arranged in a matrix form; a bit line driver circuit 1024 including a column decoder 1025, a reading circuit 1026, and a selector 1027; a word line driver circuit 1029 including a row decoder 1030 and a level shifter 1031; and an interface 1028 that interacts with the outside including a writing circuit and the like. Note that the structure of the storage circuit 102 shown in FIG. 6 is one example. The storage circuit 102 may include another circuit such as a sense amplifier, an output circuit, a buffer, and the like, and the writing circuit may be provided inside the bit line driver circuit.

The memory cell 1021 includes a first wiring forming a word line $W_y$ ($1 \leq y \leq n$), a second wiring forming a bit line $B_x$ ($1 \leq x \leq m$), a TFT 1032, and a storage element 1033. The storage element 1033 corresponds to the fuse element 114 described in Embodiment Mode 1.

Figure 5:
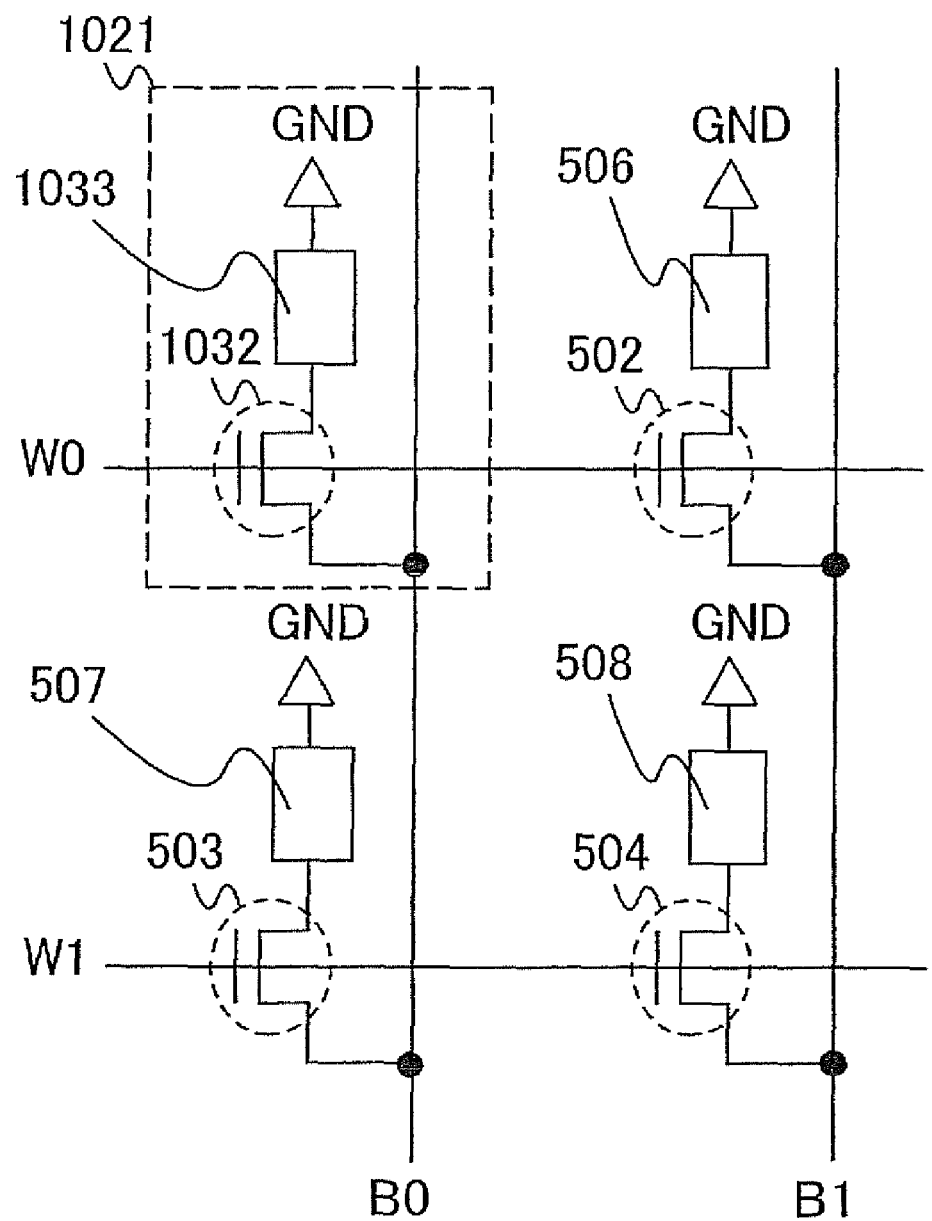
FIG. 5 is a circuit diagram showing a semiconductor device mounted with a fuse memory of the present invention.

Next, writing and reading operations of a memory cell of the present invention are described with reference to FIG. 5. Note that here, a state in which "1" is written in the memory cell is called a second state (insulated state), and a state in which "0" is written is called a first state (conductive state).

First, an example of a circuit operation for writing "1" in the memory cell 1021 is described. A writing process is performed by selecting a word line $W_0$ of the memory cell 1021 and feeding a current to a bit line $B_0$. In other words, a memory cell in which writing is desired is selected with the word line $W_0$, and voltage is applied that can make the storage element 1033 transition from the first state (conductive state) to the second state (insulated state) and insulate the storage element 1033 or make it have high resistance. For example, say that this voltage is 10 V. At this time, a TFT 502, a TFT 503, and a TFT 504 are turned off so that writing in a storage element 506, a storage element 507, and a storage element 508 in other memory cells is prevented. For example, a word line $W_1$ and a bit line $B_1$ may be 0 V (reference potential). By applying voltage to the bit line $B_0$ enough for the storage element 1033 to transition from the first state to the second state while only the word line $W_0$ is selected, "1" can be written in the storage element 1033.

Subsequently, an example of a reading process of the memory cell 1021 is described. The reading process may differentiate between whether the storage element 1033 in the memory cell 1021 is in the second state (insulated state) in which "1" is written or the first state (conductive state) in which "0" is written. A case of reading whether the memory cell 1021 is in a state in which "0" is written or "1" is written is described. The word line $W_0$ is selected to turn on the TFT 1032. Here, a predetermined voltage is applied to the bit line $B_0$ while the TFT 1032 is termed on. Here, the predetermined voltage is 5 V. At this time, if the storage element 1033 is in the first state, that is, in a conductive state, current flows to a wiring for grounding in the memory cell 1021, and voltage of the bit line $B_0$ becomes 0 V. On the other hand, if the storage element 1033 is in the second state, that is, in an insulated (high resistance) state, current does not flow to the wiring for grounding in the memory cell 1021, and voltage of the bit line $B_0$ remains 5 V. In this manner, whether "0" or "1" is written can be differentiated by voltage of the bit line.

As described above, the fuse element of the present invention can perform a writing process and a reading process, but it can also be used to manufacture a higher-security fuse memory. For example, in this embodiment mode, voltage of a bit line when writing is set to be 10 V and that when reading is set to be 5 V. If writing is to be performed only during initialization, a structure may be that in which voltage of the bit line can be raised to 10 V only during initialization and that which cannot be raised to 10 V after initialization. For example, the structure may be that in which voltage can only be raised to 7 V. A charge pump circuit or the like may be used for raising voltage.

Figure 2A:
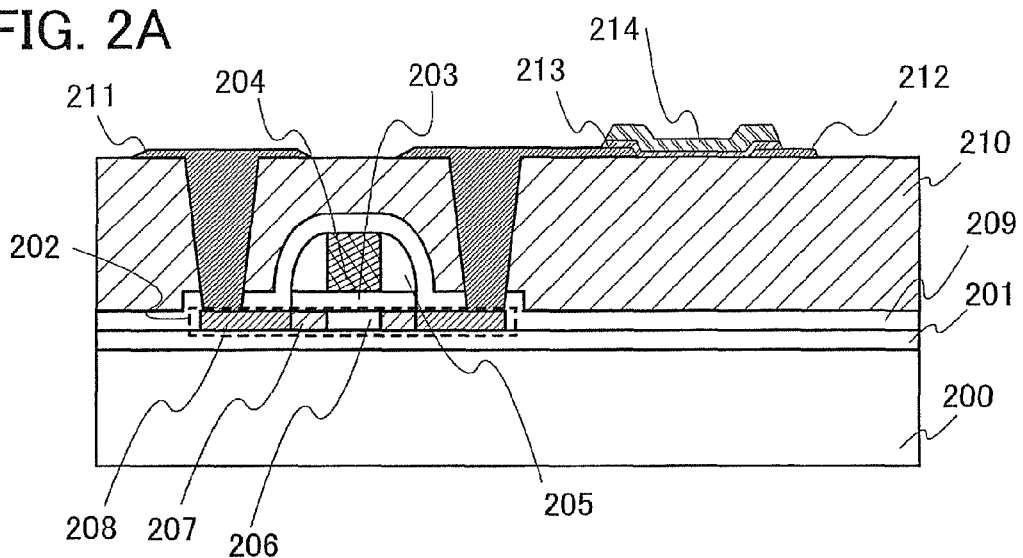
FIGS. 2A to 2C are diagrams showing a fuse element of the present invention formed over a TFT substrate.

Next, a manufacturing process of a semiconductor device of the present invention is described with reference to FIG. 2A. Note that although FIG. 2A only shows a cross-sectional diagram of a TFT portion and fuse element portions manufactured by applying the present invention, the present invention is not limited thereto, and may include another layer as necessary.

As a substrate 200, a glass substrate which is a substrate having an insulating property can be used. Alternatively, a plastic substrate, which is a flexible substrate, a quartz substrate, or the like, may be used. With a glass substrate, there is no limitation on its area or shape. Therefore, by using a rectangular glass substrate that has for example one side of 1 m or longer as the substrate 200, productivity can be dramatically improved. This point is a significant advantage when compared to a case of using a circular monocrystalline silicon substrate. Also, when the substrate 200 is a plastic substrate, it is easy to process it into a flexible form with excellent design since it is thin, light, and can be bent. Further, since it has an excellent shock resistance property and can be attached or embedded in a variety of items, it can be utilized in a wide variety of fields. Also, when the substrate 200 is a plastic substrate, it is necessary to use heat-resistant plastic that can withstand treatment temperature of a manufacturing process. Preferably, after a peeling layer is provided over the glass substrate and a TFT is provided over the peeling layer, the TFT is peeled off and the peeled TFT is provided over the plastic substrate.

A first insulating layer 201 is formed over the substrate 200. The first insulating layer 201 prevents entrance of an impurity from the substrate 200. The first insulating layer 201 is formed of a single layer or stacked layers of a layer containing an oxide of silicon or a nitride of silicon, by a sputtering method, a plasma CVD method, or the like. An oxide material of silicon corresponds to a substance containing silicon (Si) and oxygen (O) such as silicon oxide, silicon oxide containing nitrogen (silicon oxynitride), or the like. A nitride material of silicon corresponds to a substance mainly containing silicon and nitrogen (N) such as silicon nitride, silicon nitride containing oxygen (silicon nitride oxide), or the like. Note that the insulating layer 201 is not provided when it is not necessary. Here, the insulating layer 201 is formed with silicon oxynitride.

Subsequently, a semiconductor layer 202 is formed over the first insulating layer 201. Silicon is used for the semiconductor layer 202. In forming the semiconductor layer 202, a semiconductor material gas typified by silane can be used. For the semiconductor layer 202, an amorphous semiconductor film formed by an LPCVD method, a plasma CVD method, a vapor growth method, or a sputtering method can be used. Further, a polycrystalline semiconductor film or a semi-amorphous semiconductor (hereinafter referred to as "SAS") film, that is an amorphous semiconductor film crystallized by light energy or heat energy, or the like may be used, and the film thickness may be 25 to 200 nm (preferably 50 to 150 nm). Note that SAS also includes a microcrystalline semiconductor. Here, the semiconductor layer 202 is fowled by patterning a polycrystalline semiconductor film crystallized by laser irradiation.

Next, an impurity element is introduced to the semiconductor layer 202 by an ion implantation method or the like. The impurity element to be introduced is an impurity element having the opposite conductivity type from that of a TFT. That is, an impurity element imparting p-type is introduced to an n-type TFT, and an impurity element imparting n-type is introduced to a p-type TFT. For the impurity element imparting n-type, phosphorus (P), arsenic (As), or the like can be used. For the impurity element imparting p-type, boron (B), aluminum (Al), gallium (Ga), or the like can be used. This step is called channel doping. By performing channel doping, the threshold of the TFT can be controlled.

Subsequently, a second insulating layer 203 is formed over the semiconductor layer 202. The second insulating layer can be fowled with a similar material to that of the first insulating layer. That is, silicon oxide, silicon oxynitride, silicon nitride oxide, silicon nitride, or the like may be formed by a sputtering method, a plasma CVD method, or the like. Here, the second insulating layer 203 is formed of silicon oxynitride.

Then, a first layer 204 is formed. The first layer 204 may be a single layer or stacked layers. When the first layer 204 is formed as a single layer, a film containing an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), copper (Cu), silicon (Si), and germanium (Ge); a film containing an alloy material or compound material mainly containing the element, or the like can be used. Here, the first layer 204 is formed such that tungsten (W) is stacked over tantalum (Ta) to have a stacked-layer structure and patterned.

Next, a sidewall 205 is formed by performing dry etching after forming an insulating layer. For the insulating layer, an insulating layer mainly containing silicon oxide is used. Alternatively, silicon oxynitride or silicon nitride oxide may be used instead of silicon oxide. A material and method used in forming the insulating layer are similar to those of the first insulating layer 201 and the second insulating layer 203. The sidewall 205 is formed by performing dry etching with respect to the insulating layer formed over an entire surface. The sidewall 205 is an insulating layer formed over a side wall of the first layer 204.

Subsequently, an impurity is introduced to the semiconductor layer 202 with the sidewall 205 formed. By introducing the impurity by an ion implantation method with the existence of the sidewall 205, two regions with different concentrations are formed in an impurity region of the semiconductor layer 202. That is, the semiconductor layer 202 of a region that overlaps with the sidewall 205 becomes a low-concentration impurity region 207 and the semiconductor layer 202 of a region that does not overlap with the sidewall 205 becomes a high-concentration impurity region 208. Here for example, an n-type TFT can be formed by adding phosphorus (P) as an impurity element so as to be contained at a concentration of about $5\times10^{19}$ to $5\times10^{20}/cm^3$. Also, an impurity element imparting p-type may be added to form a p-type TFT. As the impurity element imparting n-type, phosphorus (P), arsenic (As), or the like can be used. As the impurity element imparting p-type, boron (B), aluminum (Al), gallium (Ga), or the like can be used. Note that a region that overlaps with the first layer becomes a channel forming region 206.

Further, although a case of forming an LDD region by introducing the impurity element after forming the sidewall is described in this embodiment mode, the low-concentration impurity region may be formed by introducing (light doping) the impurity before forming the sidewall and then introducing (heavy doping) the impurity again after forming the sidewall. In this case, during light doping, acceleration voltage or the like of ions is controlled so that amount of impurity added is little, and during heavy doping, the impurity may be introduced under such an approximate condition as under which the high-concentration impurity region is formed. In the n-type TFT, the impurity imparting n-type is introduced during both light doping and heavy doping.

Then, a third insulating layer 209 is formed. The third insulating layer 209 is formed using similar materials to those of the first insulating layer 201 and the second insulating layer 203.

Next, a fourth insulating layer 210 is formed. The fourth insulating layer 210 is formed by a similar material and method to those of the first insulating layer 201 or the like; however, the fourth insulating layer 210 is more preferably formed of an organic material typified by polyimide, acrylic, or the like, by a coating method or the like.

Subsequently, an opening is formed in the third insulating layer 209 and the fourth insulating layer 210. The opening may be formed by a dry etching method under an etching condition appropriate for a material of a layer to be opened. The etching is performed so as to expose the high-concentration impurity region 208 of the semiconductor layer 202. A second layer 211 is formed after forming the opening. The second layer 211 may be formed using a similar material and method as those of the first layer 204.

Then, a fuse element is formed. First, a terminal electrode 212 of the fuse element is formed. The terminal electrode 212 of the fuse element can be formed in a similar manner to the first layer 204 or the like. Here, the terminal electrode 212 may be formed in a similar manner to the second layer 211 or may be formed in the same layer as the second layer 211. Here, the terminal electrode 212 is formed using titanium.

Subsequently, a first fuse layer 213 and a second fuse layer 214 are formed. The first fuse layer 213 and the second fuse layer 214 correspond to the first fuse layer 112 and the second fuse layer 113 in Embodiment Mode 1. The first fuse layer 213 uses a conductive oxide, and a substance that becomes a precursor in forming an insulating oxide is used for the second fuse layer 214. Here, ITO is used for the first fuse layer 213 and aluminum is used for the second fuse layer 214. By continuously forming the first fuse layer 213 and the second fuse layer 214 to be stacked layers, a fuse element of the present invention can be formed. Also, their order of stacking may be reversed. That is, the substance that becomes a precursor in forming an insulating oxide may be used to form the first fuse layer 213 and the conductive oxide may be used to farm the second fuse layer 214. However, it is preferable to use the conductive oxide for the first fuse layer 213 and the substance that becomes a precursor in forming an insulating oxide for the second fuse layer 214.

In an element formed as described above in which the TFT and the fuse element are formed over the same substrate, a desired fuse element can be selected by the TFT to become insulating or high resistant. A portion of a circuit diagram of the TFT and fuse element of which a manufacturing method in this embodiment mode is described is shown in FIG. 5. In FIG. 5, fuse elements each provided with a TFT are arranged in a matrix form. By having such a structure, a fuse memory can selectively become insulating or high resistant, using the TFT.

Figure 2B:
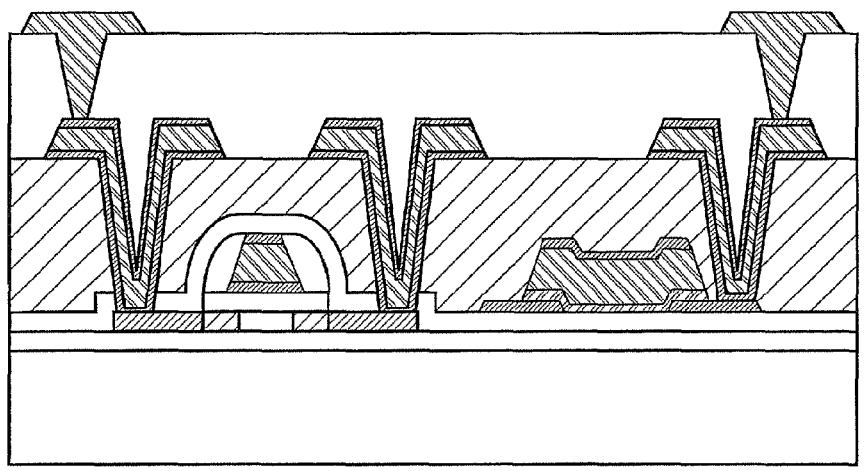
Figure 2C:
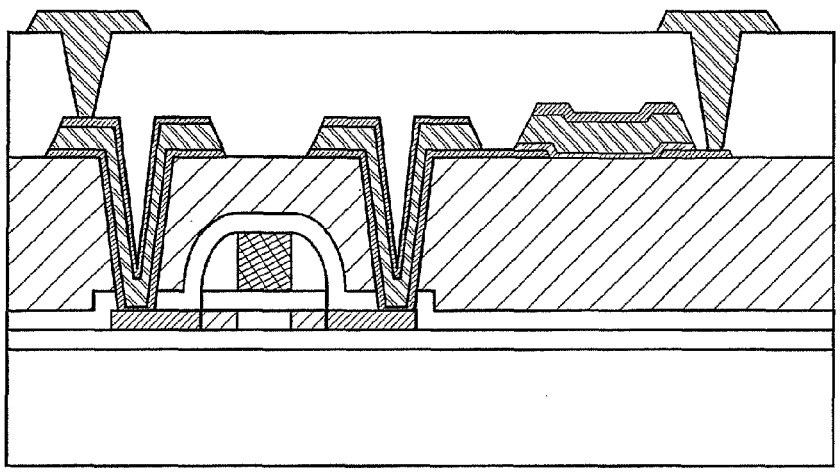

Note that the present invention is not limited to the foregoing. For example, as shown in FIG. 2B, the fuse element may be formed of the same layer as the first layer that functions as a gate electrode of the TFT, in the same step. Alternatively, the fuse element may be formed of the same layer as the second layer that functions as a source electrode and drain electrode of the TFT, in the same step, as shown in FIG. 2C.

In the above manlier, by the present invention, a small-size fuse element can be manufactured over an insulating substrate using a TFT manufacturing process. Also, since deformation of a wiring does not occur as it does with a conventional fuse in which a junction is broken or melting is performed, there is no effect on a wiring portion except a fuse portion, and degradation of a characteristic or reduction in yield can be prevented. Further, since a memory using a fuse element can only be written once, by using the present invention in a storage circuit such as an ID chip, a high-security semiconductor device can be provided.

Embodiment Mode 3

Figure 7E:
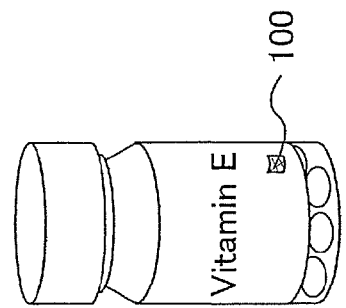
FIGS. 7A to 7F are diagrams each showing an example of mounting a semiconductor device of the present invention.
Figure 7F:
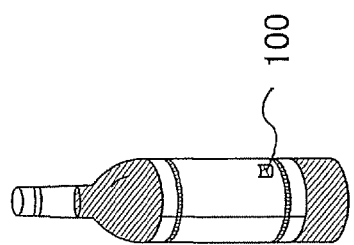
Figure 7C:
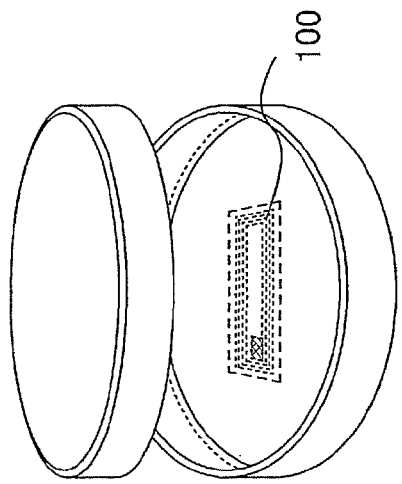
Figure 7D:
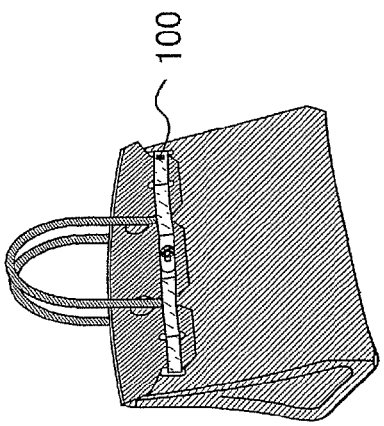
Figure 7A:
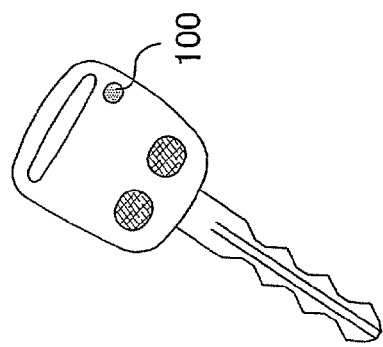
Figure 7B:
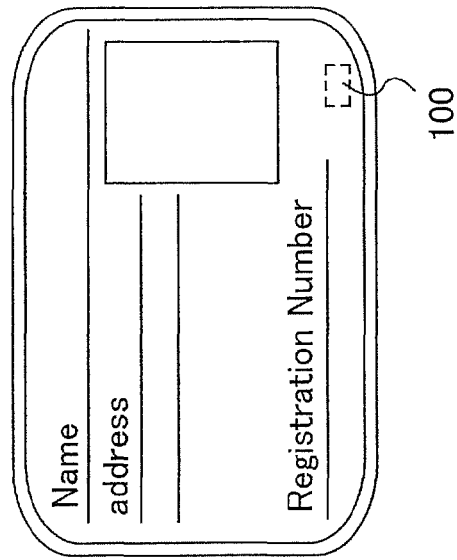

The semiconductor device 100 to which the present invention is applied can be used for a variety of items and systems by utilizing a function of transmitting and receiving an electromagnetic wave. As the items, the following are given: keys (see FIG. 7A), paper money, coins, securities, bearer bonds, certificates (such as a driver's license or a resident's card, see FIG. 7B), books, containers (such as a Petri dish, see FIG. 7C), packaging containers (such as wrapping paper or bottles, see FIGS. 7E and 7F), recording media (such as a disk or video tape), vehicles (such as a bicycle), personal accessories (such as shoes or eyeglasses, see FIG. 7D), food, clothing, livingware, electronic appliances (such as a liquid crystal display device, an EL display device, a television device, or a portable terminal), or the like. The semiconductor device of the present invention is fixed to items of a variety of forms such as those above by being attached or embedded on a surface. Further, a system refers to a goods management system, an authentication function system, a distribution system, or the like, and by using the semiconductor device of the present invention, the system can be more sophisticated, multifunctional, and high-value added. This embodiment mode can be freely combined with the other embodiment modes.

This application is based on Japanese Patent Application serial no. 2006-188417 filed in Japan Patent Office on Jul. 7 in 2006, the entire contents of which are hereby incorporated by reference.

What is claimed is:

1. A fuse element comprising:
   a first layer comprising a compound containing nitrogen; and
   a second layer having a conductive property,
   wherein the first layer is at least partially in contact with the second layer, and
   wherein a part of the second layer is capable of being nitrided with heat by feeding current to at least one of the first layer and the second layer so that an electrical resistance of the second layer is high.

2. The fuse element according to claim 1, wherein the compound containing nitrogen is nitride.

3. The fuse element according to claim 1, wherein the compound containing nitrogen is oxynitride.

4. The fuse element according to claim 1, wherein the first layer has a conductive property.

5. The fuse element according to claim 1, wherein the second layer includes at least one selected from the group consisting of aluminum, bismuth and tin.

6. A semiconductor device including the fuse element according to claim 1.

7. A storage circuit including the fuse element according to claim 1.

8. The storage circuit according to claim 7, further comprising a plurality of the fuse elements, wherein the plurality of the fuse elements are arranged in a matrix form.

9. The storage circuit according to claim 8, wherein a transistor is connected to one of the fuse elements.

10. A semiconductor device including the storage circuit according to claim 7.

11. A fuse element comprising:
    a first layer comprising a compound containing nitrogen;
    a second layer having a conductive property; and
    a third layer partially in contact with the first layer,
    wherein the second layer is at least partially in contact with the first layer,
    wherein the third layer has a conductive property,
    wherein the third layer comprises a first electrode and a second electrode, and
    wherein a part of the second layer is capable of being nitrided with heat by feeding current between the first electrode and the second electrode so that an electrical resistance of the second layer is high.

12. The fuse element according to claim 11, wherein the compound containing nitrogen is nitride.

13. The fuse element according to claim 11, wherein the compound containing nitrogen is oxynitride.

14. The fuse element according to claim 11, wherein the first layer has a conductive property.

15. The fuse element according to claim 11, wherein the second layer includes at least one selected from the group consisting of aluminum, bismuth and tin.

16. A semiconductor device including the fuse element according to claim 11.

17. A storage circuit including the fuse element according to claim 11.

18. The storage circuit according to claim 17, further comprising a plurality of the fuse elements, wherein the plurality of the fuse elements are arranged in a matrix form.

19. The storage circuit according to claim 18, wherein a transistor is connected to one of the fuse elements.

20. A semiconductor device including the storage circuit according to claim 17.

21. A fuse element comprising:
    a first layer comprising a compound containing nitrogen;
    a second layer having a conductive property; and
    a third layer partially in contact with the second layer,
    wherein the second layer is at least partially in contact with the first layer,
    wherein the third layer has a conductive property,
    wherein the third layer comprises a first electrode and a second electrode, and
    wherein a part of the second layer is capable of being nitrided with heat by feeding current between the first electrode and the second electrode so that an electrical resistance of the second layer is high.

22. The fuse element according to claim 21, wherein the compound containing nitrogen is nitride.

23. The fuse element according to claim 21, wherein the compound containing nitrogen is oxynitride.

24. The fuse element according to claim 21, wherein the first layer has a conductive property.

25. The fuse element according to claim 21, wherein the second layer includes at least one selected from the group consisting of aluminum, bismuth and tin.

26. A semiconductor device including the fuse element according to claim 21.

27. A storage circuit including the fuse element according to claim 21.

28. The storage circuit according to claim 27, further comprising a plurality of the fuse elements, wherein the plurality of the fuse elements are arranged in a matrix form.

29. The storage circuit according to claim 28, wherein a transistor is connected to one of the fuse elements.

30. A semiconductor device including the storage circuit according to claim 27.

* * * * *

UNITED STATES PATENT AND TRADEMARK OFFICE
CERTIFICATE OF CORRECTION

| | | |
|---|---|---|
| PATENT NO. | : 8,110,893 B2 | Page 1 of 1 |
| APPLICATION NO. | : 12/837060 | |
| DATED | : February 7, 2012 | |
| INVENTOR(S) | : Kengo Akimoto | |

It is certified that error appears in the above-identified patent and that said Letters Patent is hereby corrected as shown below:

At column 1, line 60, "Organic." should be --Organic--;

At column 2, line 30, "fanned" should be --formed--;

At column 4, line 19, "Mimed" should be --formed--;

At column 4, line 40, "fauns" should be --forms--;

At column 6, line 33, "foamed" should be --formed--;

At column 8, line 46, "faint" should be --form--;

At column 10, line 55, "fowled" should be --formed--;

At column 11, line 5, "fowled" should be --formed--;

At column 12, line 41, "farm" should be --form--;

At column 12, line 62, "manlier" should be --manner--.

Signed and Sealed this
Fourth Day of December, 2012

David J. Kappos
*Director of the United States Patent and Trademark Office*